US006932558B2

(12) United States Patent
Wu

(10) Patent No.: US 6,932,558 B2
(45) Date of Patent: Aug. 23, 2005

(54) WAFER ALIGNER

(76) Inventor: Kung Chris Wu, 1695 Heron Ave., Sunnyvale, CA (US) 94087

( * ) Notice: Subject to any disclaimer, the term of this patent is extended or adjusted under 35 U.S.C. 154(b) by 0 days.

(21) Appl. No.: 10/190,111

(22) Filed: Jul. 3, 2002

(65) Prior Publication Data

US 2004/0005212 A1 Jan. 8, 2004

(51) Int. Cl.[7] ......................... B65G 29/00; B65G 49/07
(52) U.S. Cl. ...................... 414/757; 414/433; 414/936
(58) Field of Search .................... 414/433, 754, 414/757, 936, 941

(56) References Cited

U.S. PATENT DOCUMENTS

| 3,902,615 A | | 9/1975 | Levy et al. |
|---|---|---|---|
| 3,969,004 A | | 7/1976 | Schliemann |
| 4,311,427 A | | 1/1982 | Coad et al. |
| 4,662,811 A | | 5/1987 | Hayden |
| 4,887,904 A | | 12/1989 | Nakazato et al. |
| 5,183,378 A | | 2/1993 | Asano et al. |
| 5,421,056 A | * | 6/1995 | Tateyama et al. ............. 15/302 |
| 5,516,732 A | | 5/1996 | Flegal |
| 5,566,466 A | * | 10/1996 | Hearne ........................ 414/936 |
| 5,851,041 A | * | 12/1998 | Anderson et al. ........... 414/941 |
| 5,880,479 A | | 3/1999 | Wang |
| 6,012,192 A | | 1/2000 | Sawada et al. |
| 6,132,289 A | | 10/2000 | Labunsky et al. |
| 6,178,361 B1 | | 1/2001 | George et al. |

FOREIGN PATENT DOCUMENTS

| JP | 04157756 | 5/1992 |
|---|---|---|
| JP | 04162447 | 6/1992 |
| JP | 07335724 | 12/1995 |

* cited by examiner

Primary Examiner—Gene O. Crawford
(74) Attorney, Agent, or Firm—John Vanden Bosche

(57) ABSTRACT

A prealigner for aligning a disk-like work piece such as a silicon wafer, by centering and rotationally orienting the work piece. The prealigner centers and orients the work piece while only touching the periphery of the work piece using a plurality of wafer rollers and an air bearing table to support the weight of the wafer. The prealigner can accept a range of different diameters of work piece without modification because the wafer rollers are radially moveable until they contact and center the work piece. The prealigner includes a plurality of simple optical sensors for detecting a notch in the work piece and the work piece is rotationally oriented based on a notch detection signal from the optical sensors.

18 Claims, 13 Drawing Sheets

WAFER ALIGNER

FIELD OF THE INVENTION

This invention relates to prealigners for centering and orienting semiconductor wafers, and more particularly, to a prealigner which can process a variety of wafer diameters.

BACKGROUND OF THE INVENTION

Microchips are made from extremely pure circular wafers of silicon. This extreme purity of the wafers requires extremely clean processing environments since even extremely small impurities or particle deposits can ruin a wafer. This is becoming more critical as the line size of wafer features become smaller, and even smaller impurities are harmful. Semiconductor manufacturing involves a number of processes, each requiring different tools and equipment, mostly robotic, all within a sealed clean environment. To further protect the wafers from contamination they are transported from station to station using sealed carriers.

Many tools in a semi-conductor manufacturing line require the wafers to be placed in the tool in an exact orientation. Since wafers' orientations are randomly positioned in the carriers, a device must be used to find the orientation of the wafers relative to robots that move the wafers in and out of the tools. This tool is known as a wafer prealigner in the semi-conductor industry. After the robot picks up a wafer from its carrier, it is placed on the prealigner to find the wafer center and orientation. A conventional prior art prealigner utilizes a turntable and a linear CCD array. The linear array is oriented along the radial axis of the turntable, typically centered on the edge of the wafer.

Each piece of equipment in a semiconductor manufacturing line is costly and many operations require a prealigner. Since there are several different diameters of wafer and prealigners are diameter specific, several prealigners may be required for each process. Furthermore, since setting up the prealigner takes time and human intervention, the prealigner can be a bottle neck in a semi-conductor processing line. In prior art prealigners, a wafer is placed on a turntable by a robot, and secured with a vacuum. Then the wafer is spun about the center axis of the turntable, and if the wafer center coincides with the center of the turntable no edge movement will be observed by a linear CCD array. If the wafer center is offset from the center of the turntable, a sinusoidal movement of the wafer edge relative to the linear CCD array can be observed. By processing the sinusoidal movements of the wafer edge relative to the wafer rotation angles, the position of the wafer center can be calculated. After the wafer center is determined, the wafer center is moved to the center of the turntable by using three vertical pins underneath the wafer. The pins rise up and lift the wafer above the turntable and then move laterally to align the wafer and turntable centers. Appropriate combinations of rotation by the turntable and horizontal translation by the pins can move the wafer until it is centered on the turntable. After the centers are aligned, the wafer is spun again, and no edge movement should be observed by the CCD array. Another task that the prealigner performs is to orient the wafer to the proper angular position. Silicon wafers typically have a flat spot or a notch on them. As the wafer is rotated on the turntable, the flat spot or notch will be observed by the CCD array as an abrupt change in the edge position of the wafer. In this way the prealigner is able to measure the angular orientation of the wafer while processing the edge movement data. Once centered, appropriate rotation of the chuck can adjust the wafer to the desired angular orientation.

There are several disadvantages associated with the prior art. The first disadvantage is that the position of the linear CCD array depends on the wafer diameter. The wafer diameter must be given and a prealigner with the proper CCD array can then be installed and used to identify the wafer center and orientation. This makes the conventional wafer prealigner a size dependent device requiring the cost of multiple prealigners or CDD arrays to change between wafer diameters. It would be advantageous to provide a single wafer prealigner that is able to process a variety of wafer diameters using a simpler and less expensive edge sensor than a CCD array.

A second disadvantage of the current art prealigner is that the wafer must be moved by mechanical pins to align the centers. This causes surface contact and particle generation. It would be advantageous to provide a prealigner that centered the wafer without contacting the back of the wafer.

A third disadvantage of the current art prealigner is the large surface contact between the backside center of the wafer and the turntable. As the wafer size grows larger, and the line size of features on the wafer shrinks to sub-micron range, particles generated from physical contact become highly undesirable. It would be advantageous to provide a prealigner which has no need for a vacuum turntable, and which rotates and secures the wafer without physical contact with the center of the wafer.

The very edges of a wafer are often not used due to the inefficiency of laying out square microchips on a round wafer and physical contact here would be more desirable than in the center of the wafer. An alternative design for a prealigner is described in U.S. Pat. No. #4,887,904, the specification of which is incorporated herein by reference, which uses an air-bearing table to support the wafer and only contacts the wafer at the periphery, thus avoiding physical contact with the center of the wafer. The wafer is rotated by one of three rollers which hold the wafer by pressing radially inward on the wafer. This design is not desirable because inward pressure can cause warping or breakage of the wafer. Silicon wafers generally have a ±0.1 mm circularity tolerance which could cause large variations in inward pressure as the wafer is rotated in this design, in addition to the disturbance caused by the notch passing over the rollers, especially the driving roller. The design proposed in the above patent is also limited to a single wafer diameter. It would be advantageous to provide a prealigner which only contacts the wafer at the periphery and does not cause any inward radial pressure.

SUMMARY OF THE INVENTION

It is the primary object of the prealigner of the present invention to, with high accuracy, center and rotationally orient a disc-like work piece, such as a semiconductor wafer (wafer), containing a small cut out (notch) at its periphery. The present invention has a novel approach to centering and rotationally orienting a wafer in that it supports the wafer on an air-bearing plate, then spins the wafer with a plurality of wafer rollers which automatically center the wafer.

It is an object of the prealigner of the present invention to utilize a simpler and less expensive method of notch detection than a linear charge coupled device (CCD) array. The prealigner of the present invention automatically centers the wafer so the subtle detection of eccentricity provided by a CCD array is no longer necessary. It is only the large and sudden optical discontinuity of the notch which needs to be detected. A simple optical switch is sufficient for detecting the notch. The light source for the optical switch can be placed on the same side of the wafer as the switch. In this configuration the switch detects light reflected off of the wafer.

It is an object of the prealigner of the present invention to be able to pre-align several different diameters of silicon wafer. Hence a number of optical switches equal to the number of different diameters of wafer that are intended to be used are placed at appropriate positions on the air-bearing plate to detect the notch in the corresponding diameter wafer. To detect the diameter of a wafer, the prealigner of the present invention is equipped with a plurality of wafer rollers which swing inward simultaneously when they are actuated by a timing belt, hereinafter called the positioning belt, with a tension sensor attached thereto. Each wafer roller is attached on top of one end of a bar. A shaft and pulley are attached below the midpoint of this bar and the positioning belt is trained over the pulley. When the positioning belt is turned, the bar rotates and the wafer rollers swing inward to contact a wafer. On top of the this bar, at the end opposite the wafer roller, is an idler which supports another timing belt, hereinafter called the spinning belt, which engages with the wafer roller assembly at he other end of the bar. When the plurality of wafer rollers contact the silicon wafer, the tension in the positioning belt will increase and a tension sensor will send a signal to a microprocessor. The microprocessor will then instruct the wafer rollers to desist their inward progression and then move outward slightly in order to not cause any continued radial pressure on the wafer. The motor which runs the positioning belt and thus powers the inward (and outward) progression of the wafer rollers, has on its shaft a position sensor, the signal from which communicates to the microprocessor the position of the wafer rollers and hence indicates the diameter of the wafer contained therein. With the wafer diameter known to the processor, the processor may then select an appropriate optical switch for detecting the notch at the periphery of the wafer. Since the wafer rollers are arrayed such that a perfect circle passes through the center of each, and since the wafer rollers progress inward and outward at exactly the same rate, once the wafer is contacted by all the wafer rollers it is then perfectly centered, automatically.

It is a further object of the present invention to physically contact a wafer only at its very periphery thus avoiding contact with the middle portions of the wafer where particles generated by physical contact could spoil the wafer, hence the prealigner is notified of the diameter of the incoming wafer and the wafer rollers are brought in to the appropriate positions to receive the wafer on the lip surrounding each roller. The air table is simultaneously turned on so that when the wafer is deposited it is supported by the air bearing table and lightly resting on the lip of the wafer rollers. The air table is on to prevent thin wafers from warping since they are only supported on the peripheral edges. The wafer rollers are brought inward till the vertical surfaces of the rollers come into contact with, and center the wafer. Then the wafer rollers retract slightly from the wafer. The lip on each wafer roller is the only physical contact between the prealigner of the present invention and the wafer. The friction between the bottom of the wafer's edge and the top of the lip of the plurality of wafer rollers provide the force necessary for rotating the wafer. The wafer rollers are all connected by the spinning belt and hence rotate simultaneously at the same rate and in the same direction, each roller contributing to the force necessary to rotate the wafer. The wafer is then rotated by the plurality of wafer rollers bringing the notch over the optical switch. The motor which drives the spinning belt also has a position sensor attached to its shaft and provides the microprocessor with rotational position information. When the optical switch detects the reflection of a light projected up to the edge of the wafer, the optical switch returns a positive signal to the microprocessor. When the notch passes overhead and the light is no longer reflected back to the optical switch, the switch returns a negative signal to the microprocessor. In this way the location of the notch, and thus the rotational orientation of the wafer is determined. The microprocessor then calculates the rotation necessary to bring the wafer from its current orientation to the preferred orientation then instructs the roller motor to perform said rotation.

It should be noted that in the case of very thin wafers which may be subject to warping if only supported at the periphery, the air bearing when turned on slightly can support a portion of the weight of the wafer leaving only enough of the weight supported by the wafer rollers to provide good traction for rotating the wafer.

The foregoing objects and advantaged of the invention will be more fully understood from the following detailed description of the invention and the accompanying drawings.

DETAILED DESCRIPTION OF THE DRAWINGS

The prealigner of the present invention is described herein for use with silicon wafers, as used in the semiconductor industry for manufacturing microchips and for the manufacture of flat panel displays. Naturally the prealigner can be used for any disk-like work piece having a cut out, flat, marking or other irregularity at the perimeter to indicate rotational orientation. However the processing of such disk-like work pieces is of great concern to the semiconductor industry which is characterized by requiring extremely clean work environments and fast, accurate handling of materials.

Figure 1:
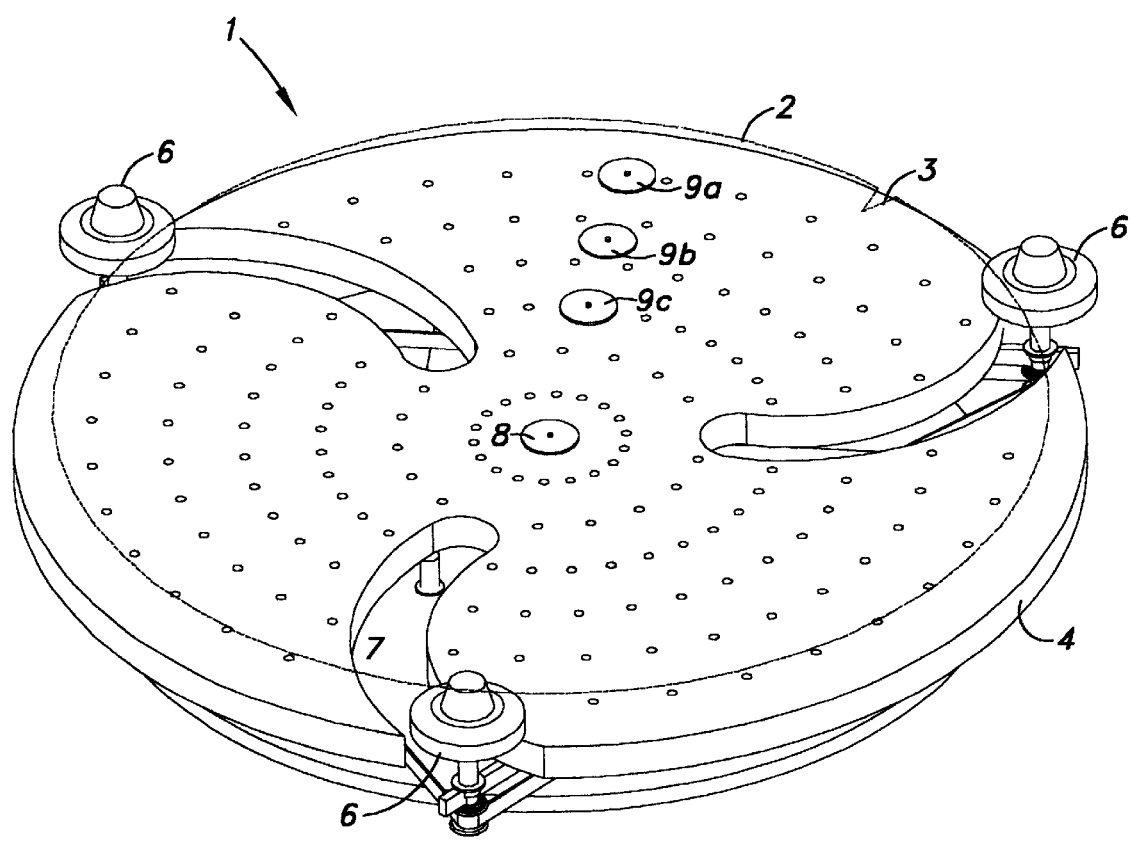
FIG. 1 is an isometric view of the present invention.

FIG. 1 shows an isometric view from above the prealigner 1 of the present invention. The preferred embodiment of the present invention is used to center and rotationally align a semiconductor wafer 2, the wafer 2 having a notch 3, or other sharp discontinuity, on its periphery. The prealigner can support some or all of the weight of a silicon wafer 2 on an air bearing plate 4 that uses compressed air and vacuum passing through small orifices in its surface to create an even cushion of air. A plurality of wafer rollers 6 supports the periphery of the wafer 2 and center and rotate the wafer 2. The present invention may work with three or more wafer rollers 6. In the preferred embodiment there are three wafer rollers 6. The wafer rollers 6 move inward and outward through arcuate slots 7 in the air bearing plate 4. A wafer presence detection switch 8 is located at the center of the air bearing plate 4 and is triggered when a wafer 2 is placed above it. A plurality of notch detection switches 9 are arrayed along a radial path, placed to detect the notch 3 of a specified diameter wafer 2. The prealigner, as illustrated, has three notch detection switches 9a, 9b, and 9c placed in appropriate positions to detect the notches 3 in six inch, eight inch, and twelve inch diameter wafers 2 respectively.

Figure 2:
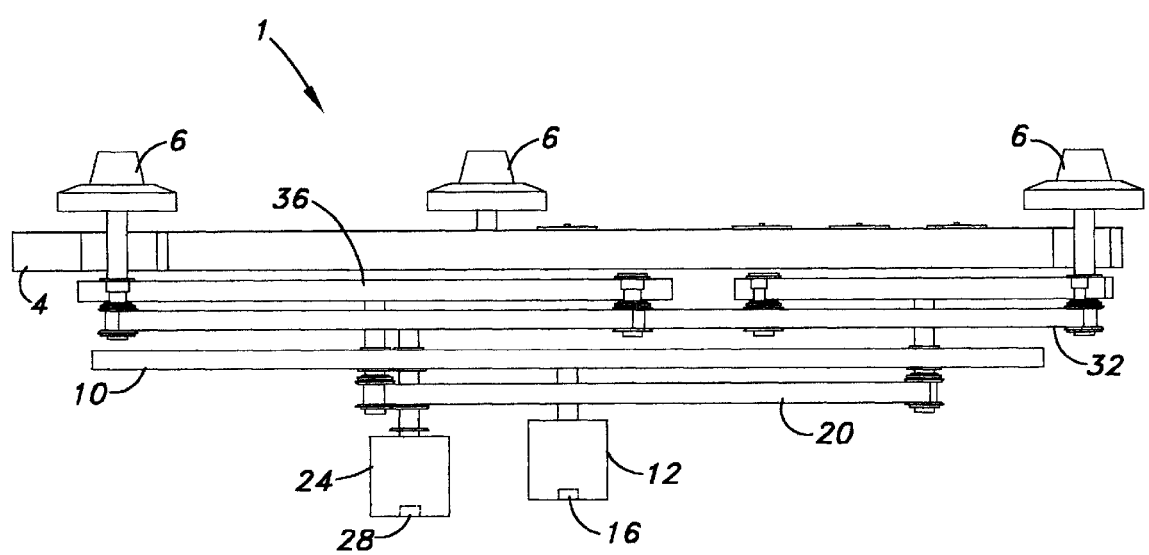
FIG. 2 is a side elevation of the present invention.
Figure 3:
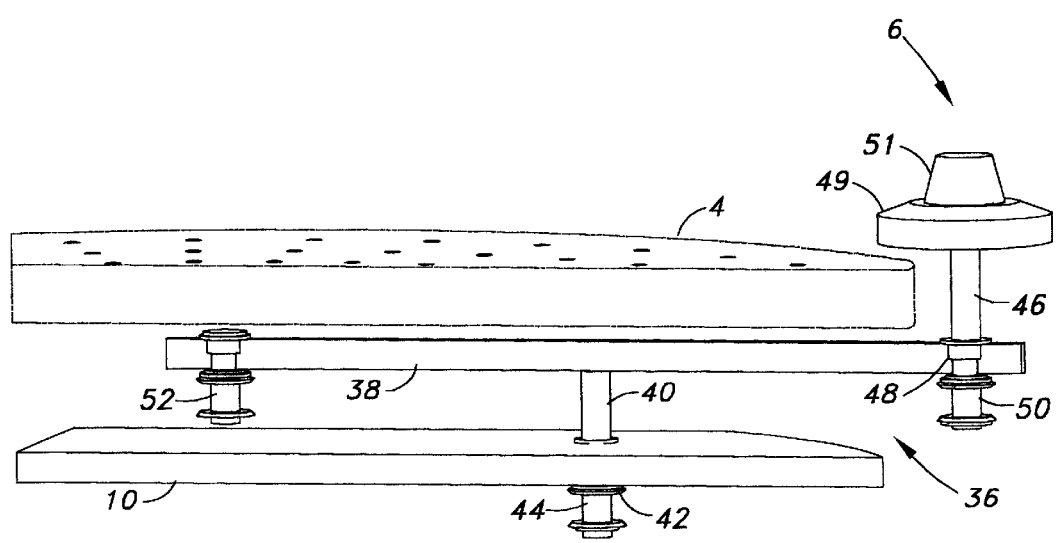
FIG. 3 is a close-up of the T-bar element of the present invention.

FIG. 2 shows a side view of the prealigner 1, showing the mechanisms of the present invention which reside below the air bearing plate 4. There is a support frame 10 on which all the other elements of the prealigner 1 are supported. A positioning motor 12 with a position sensor 16 is attached to a positioning belt 20 which is a timing belt or other non-slipping style of belt or chain. Thus since the positioning belt 20 does not slip, the position of the wafer rollers 6 can be determined by the position sensor 16 attached to the shaft of the positioning motor 12. Another motor, a spinning motor 24 has a position sensor 28 and is connected to a spinning belt 32. The spinning belt 32 is a timing belt or other device such that the spinning belt 32 does not slip. A position sensor 28 attached to the shaft of the spinning motor 24 determines the amount and direction of rotation of the wafer rollers between any two points in time. The spinning belt 32, the positioning belt 20, the support frame 10 and the wafer roller 6 are all connected to a T-bar assembly 36 which is the mechanical linkage between all these parts FIG. 3 shows a close up of a single T-bar assembly 36. The two main structural components of the T-bar assembly 36 are a crosspiece 38 and a shaft 40. The shaft 40 is secured to the support frame 10 by way of a bearing 42 such that the T-bar can rotate about the axis of the shaft 40. At the end of the shaft 40, on the opposite side of the support frame 10 from the cross piece 38, there is rigidly attached a positioning pulley 44 which has a no-slip connection with the positioning belt 20 (not shown). All three positioning pulleys 44 are the same diameter. The positioning belt 20 is then used to rotate the T-bar assembly 36 about the axis of the shaft 40.

The wafer roller 6 is securely mounted atop an axle 46. The axle 46 is secured to the crosspiece 38 of the T-bar assembly 36 by way of a bearing 48 which allows the axle 46 to rotate about its central axis. The axle passes up through the cutout 7 (not shown) in the air bearing table 4 placing the wafer roller above the air table 4. In the preferred embodiment the top edge of a lip 49 on the wafer roller 6 is approximately 10 mm above the surface of the air bearing table 4 in order to leave room for a wafer handler to access the wafer 2. At the base of the axle 46 there is rigidly secured a spinning pulley 50 which has a no-slip connection with the spinning belt 32 (not shown). Thus the spinning belt 32 is used to rotate the wafer roller 6.

The wafer roller 6 has a lip 49 around its circumference which the wafer 2 rests on and a vertical portion 51 which keeps the wafer 2 in place. In the preferred embodiment the lip 49 on the wafer roller 6 creates a shelf 10 mm deep for supporting and moving the wafer 2. The lip 49 preferably has a sloped shape at its periphery such that the wafer 2 only rests on a portion of the lip 49 during the alignment procedure, thus decreasing the surface area of contact between wafer 2 and wafer roller 6 and limiting the contact to the very edge of the wafer 2.

At the far end of the crosspiece 38 from the wafer roller 6 and axle 46 there is a freely spinning idler pulley 52 through which the spinning belt 32 passes. The central axis of the idler pulley 52 and the central axis of the spinning pulley 50 are equidistant from the central axis of the T-bar shaft 40 in opposite directions along the cross piece 38. Idler pulley 52 and the spinning pulley 50 have equal diameters. It should be noted that the diameter of positioning pulley 44 is not critical to operation of the idler pulley 52 and spinning pulley 50 and its diameter may be selected based on other design criteria.

Figure 4:
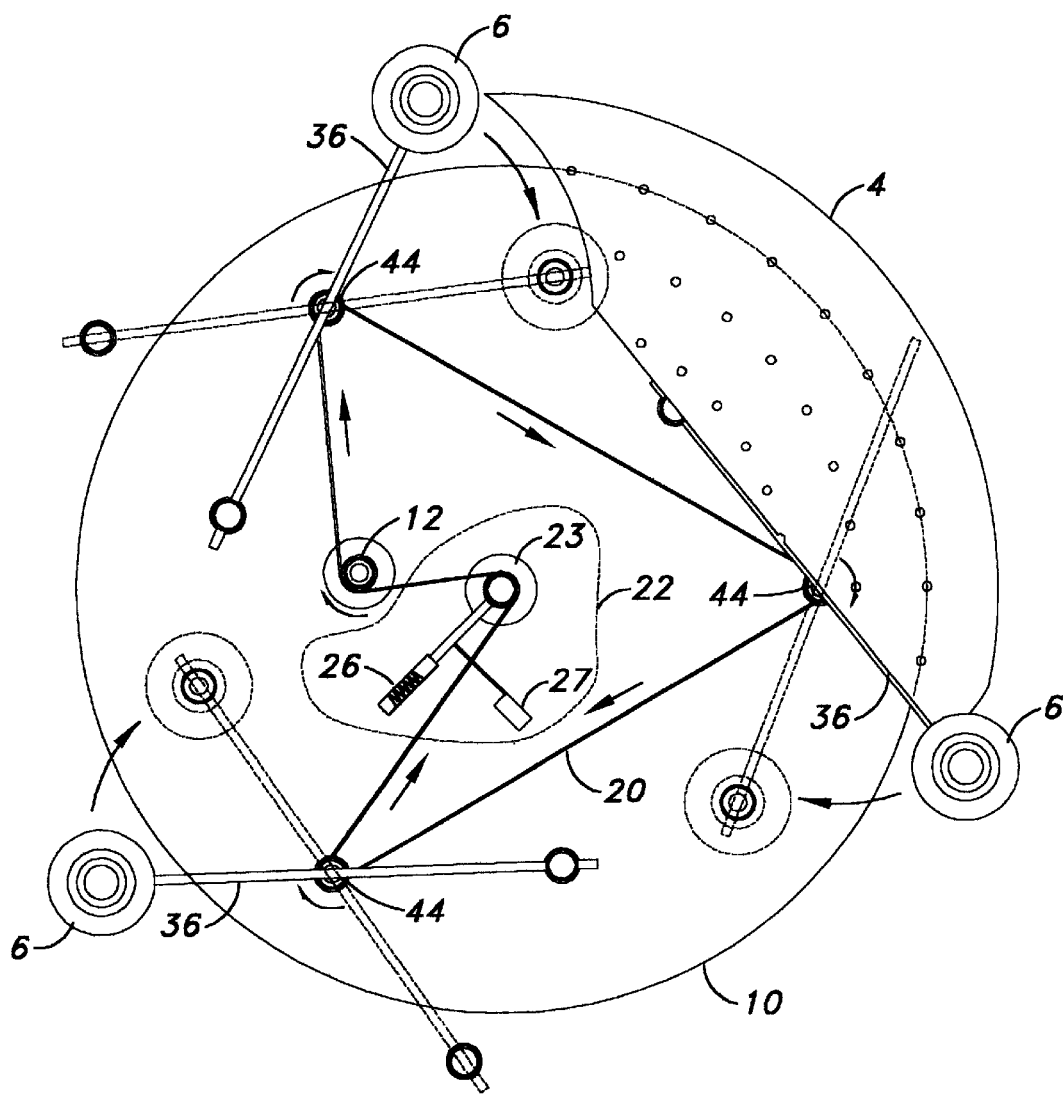
FIG. 4 is a cutaway view of the positioning belt system of the present invention.

FIG. 4 is a cutaway view showing the details of the positioning belt system. It can be seen that the positioning belt 20 is driven by the positioning motor 12 and engages the positioning pulleys 44 at the bases of the T-bar assemblies 36 and passes over a belt tension sensor assembly 22. The positioning belt 20 tension is monitored by the belt tension sensor assembly 22 in order do detect when the wafer rollers 6 have corn into contact with the wafer 2. The T-bar assemblies 36 and the wafer rollers 6 are shown in a first position (shown with solid lines) and a second position (shown in dashed lines) to illustrate the action of the positioning system. The wafer rollers 6 start in the first position. When the positioning motor 12 is turned in the direction shown by the arrow near its shaft the positioning belt 20 will travel in the direction shown by the arrows along its length. The travel of the positioning belt 20 around the positioning pulleys causes the T-bar assemblies 36 to rotate in the direction shown by the arrows near the positioning pulleys 44 thus causing the T-bar assembly and wafer roller 6 to move to its second position shown in dashed lines. The wafer roller 6 moves to the second position along the path shown by the arrow between the two positions. When centering a wafer 2 the wafer rollers 6 will move inward until all three contact the wafer 2. The present invention determines wafer roller 6 contact with the wafer 2 by use of a belt tension sensor assembly 22.

There are many ways to implement the belt tension sensor assembly 22 as will be evident to one skilled in the art. The belt tension sensor assembly 22 shown here is one way of detecting positioning belt 20 tension. It can be seen that this belt tension sensor assembly 22 consists of a pulley 23 positioned at the end of a linear spring assembly 26 with a deflection actuated transducer 27 attached. When the tension in positioning belt 20 increases, the pulley 23 will be drawn towards the spring 26 the slight motion will activate the transducer 27 which will then send a signal indicating positioning belt 20 tension has increased. It is important that the transducer 27 be activated with a very minimum of motion of the spring assembly 26. The travel of the pulley 23 towards the spring assembly must be less than the amount that would cause significant error in the centering of the wafer 2.

Figure 5:
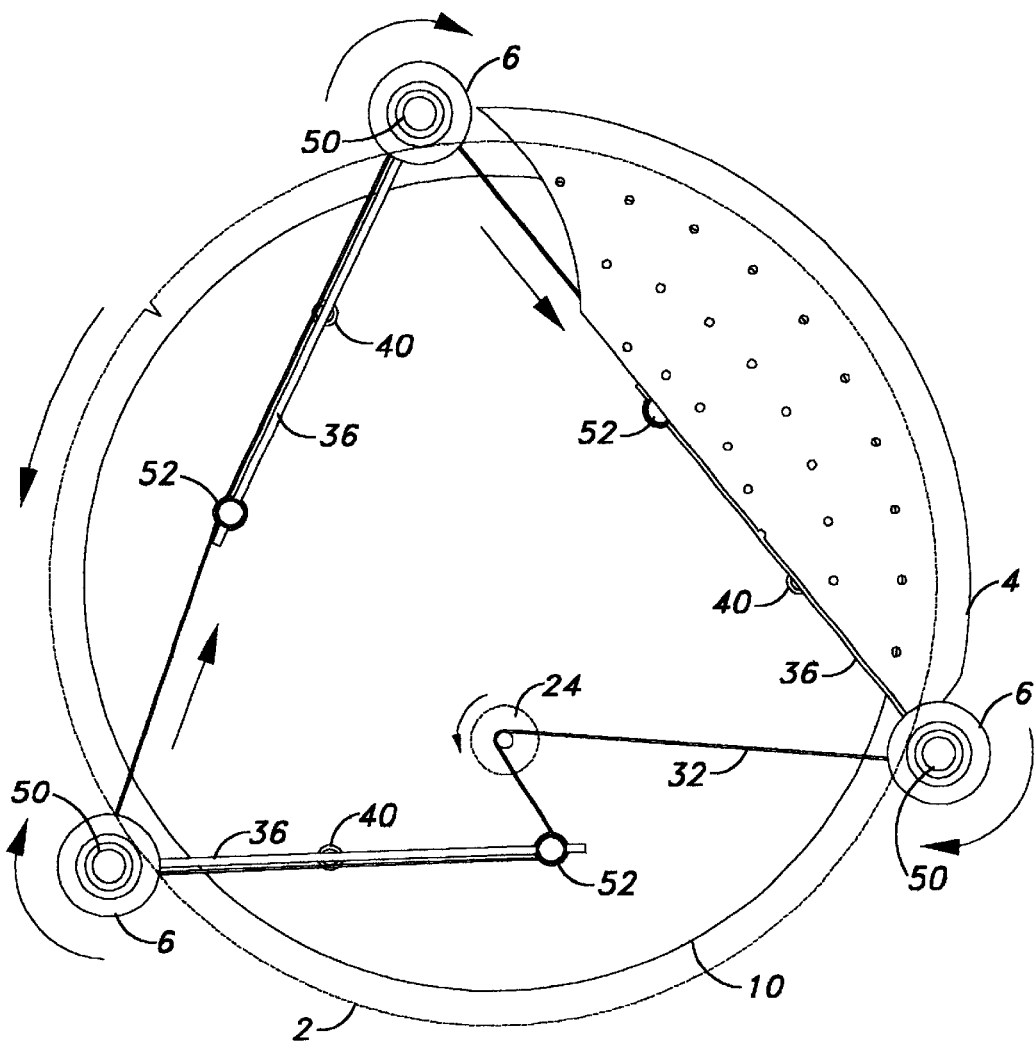
FIG. 5 is a cutaway view of the spinning belt system of the present invention.

FIG. 5 shows a cutaway view showing the details of the spinning belt system. The spinning belt 32 is driven by the spinning motor 24 and passes over each of the idler pulleys 52 and each of the spinning pulleys 50 driving the wafer rollers 6. It is important to have equal diameter idler pulleys 52 and spinning pulleys 50 and to have them placed equidistant from the center of the T-bar shaft 40. The length of spinning belt 32 on each side of the T-bar shaft must be equal so that when the T-bar assemblies 36 rotate about the shaft 40 the length of spinning belt 32 required to complete its path remains relatively constant. When the spinning motor 24 is turned counterclockwise as shown, the spinning belt 32 follows the path shown by the arrows along it causing the wafer rollers 6 to spin clockwise as shown which in turn causes the wafer 2 (drawn in phantom) to spin counterclockwise as shown.

Figure 6:
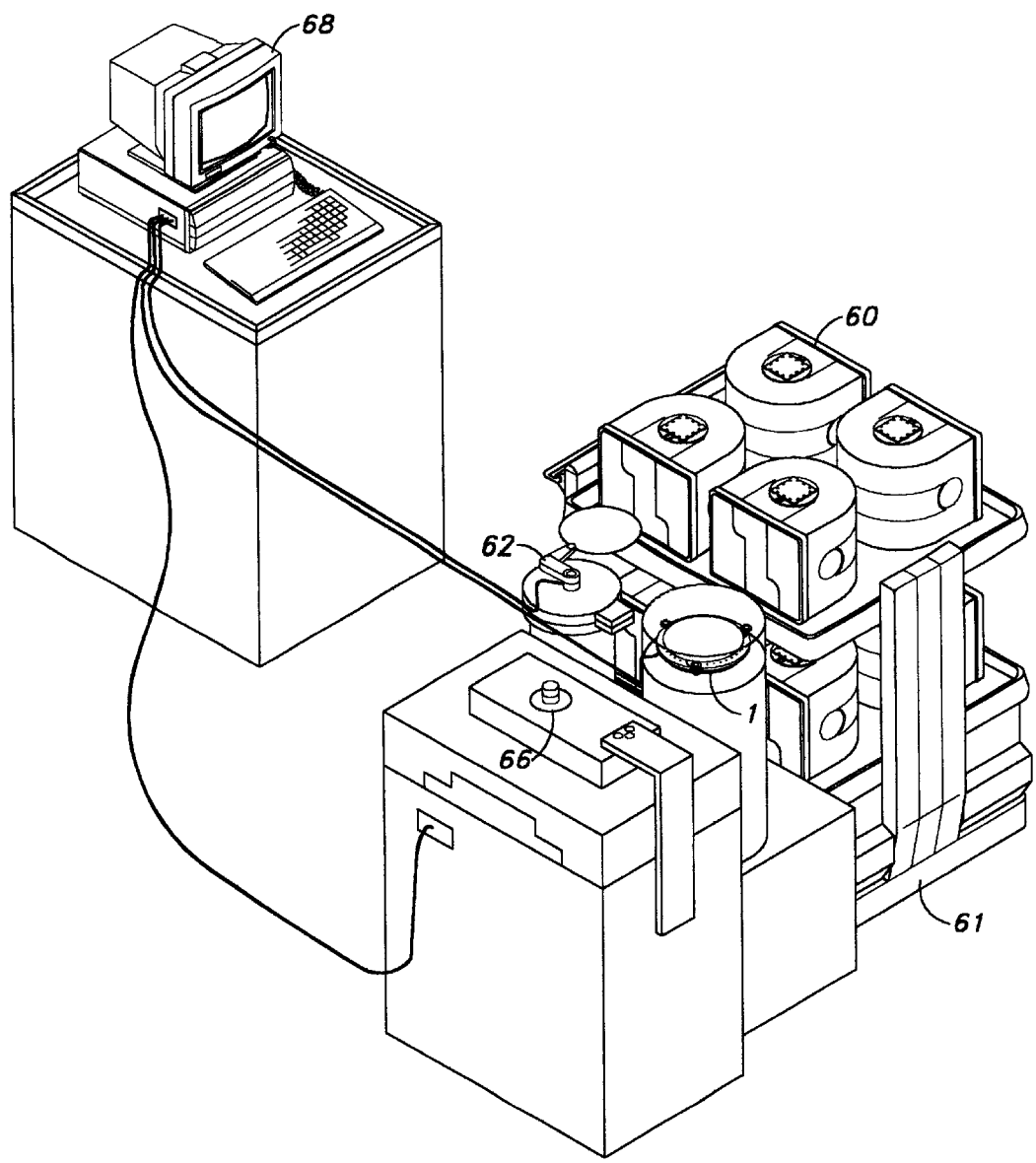
FIG. 6 shows the components of a silicon wafer processing system, including he prealigner of the present invention.

The prealigner 1 of the present invention is itself a part of a larger system. FIG. 6 shows other elements of a semiconductor processing facility that interact with the prealigner 1 of the present invention. Silicon wafers 2 are transported in cassettes 60 in which the wafers have an unspecified orientation. Several cassettes may be transported together on a cart 61. A wafer handler 62 transports the wafer 2 from the cassette 60 to the prealigner 1. The wafer handler 62 shown here uses a vacuum chuck 64 to secure the wafer 2 which may introduce contaminants to the center of the wafer. As an alternative wafer handler 62 could use an alternate design that does not come into contact with the interior of the wafer 2 and only contacts the wafer 2 at the wafer periphery to minimize contamination. After the prealigner 1 has rotationally oriented and centered the wafer 2 the wafer handler 62 transports the wafer from the prealigner 1 to a processing station 66. The processing station 66 can be any one of a variety of types of process stations such as an etcher or a testing station, however the nature of the processing station 66 is not relevant to the scope of the present invention. The prealigner 1, the wafer handler 62, and the processing station 66 are all connected to a host computer 68 which receives data from, and sends instruction to each of these devices 1, 62, 66, thus coordinating their actions.

Figure 7:
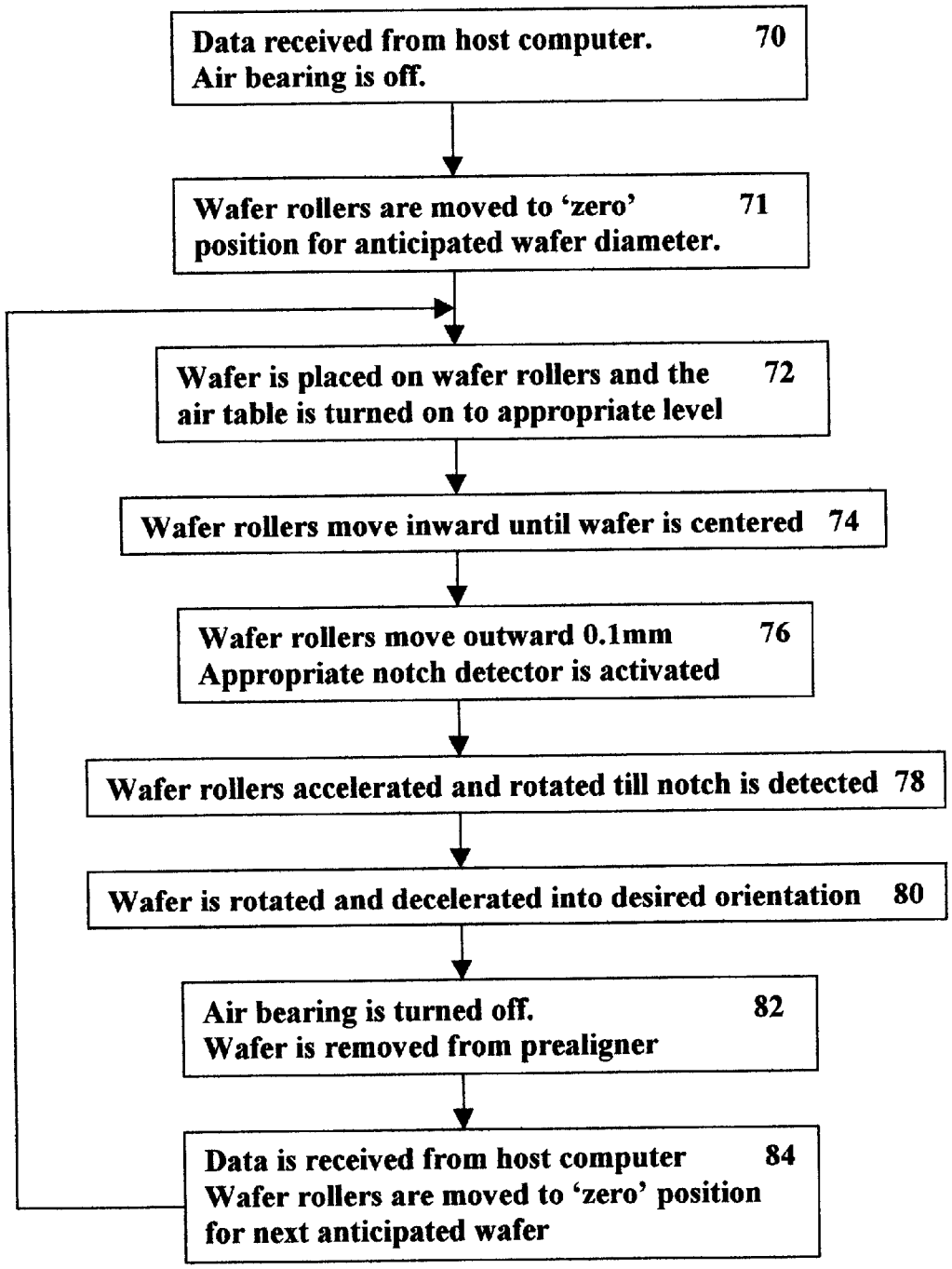
FIG. 7 is a process flowchart detailing the steps in typical operation of the prealigner of the present invention as shown in FIGS. 8, 9 and 10.
Figure 8:
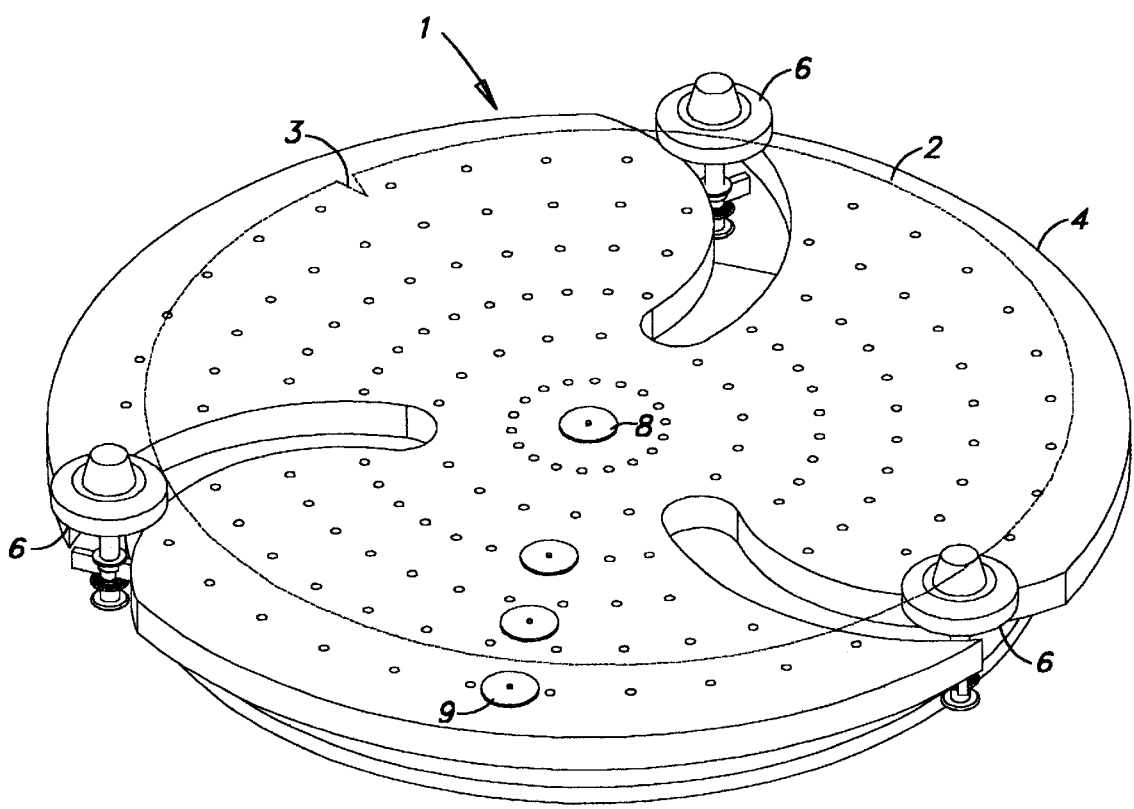
FIG. 8 shows the prealigner of the present invention in its 'zero' position.
Figure 9:
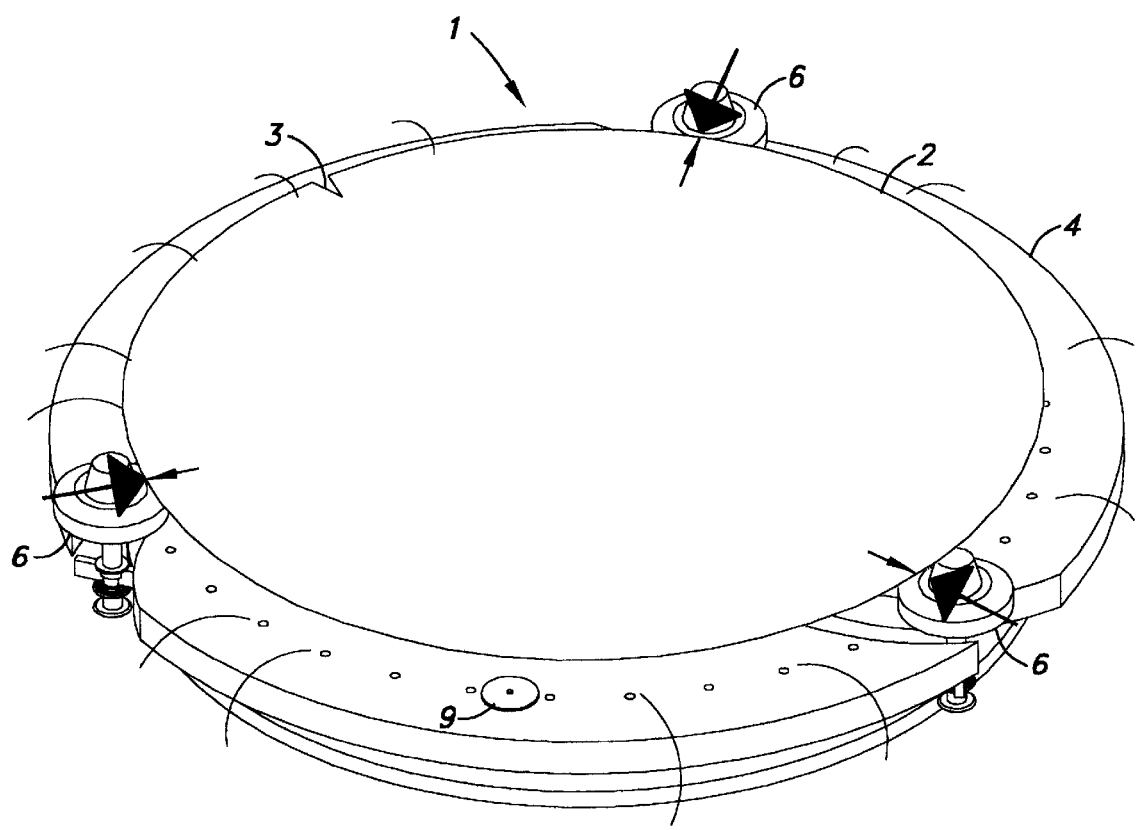
FIG. 9 shows the prealigner of the present invention at a stage after that shown in FIG. 8 in which the wafer is being centered.
Figure 10:
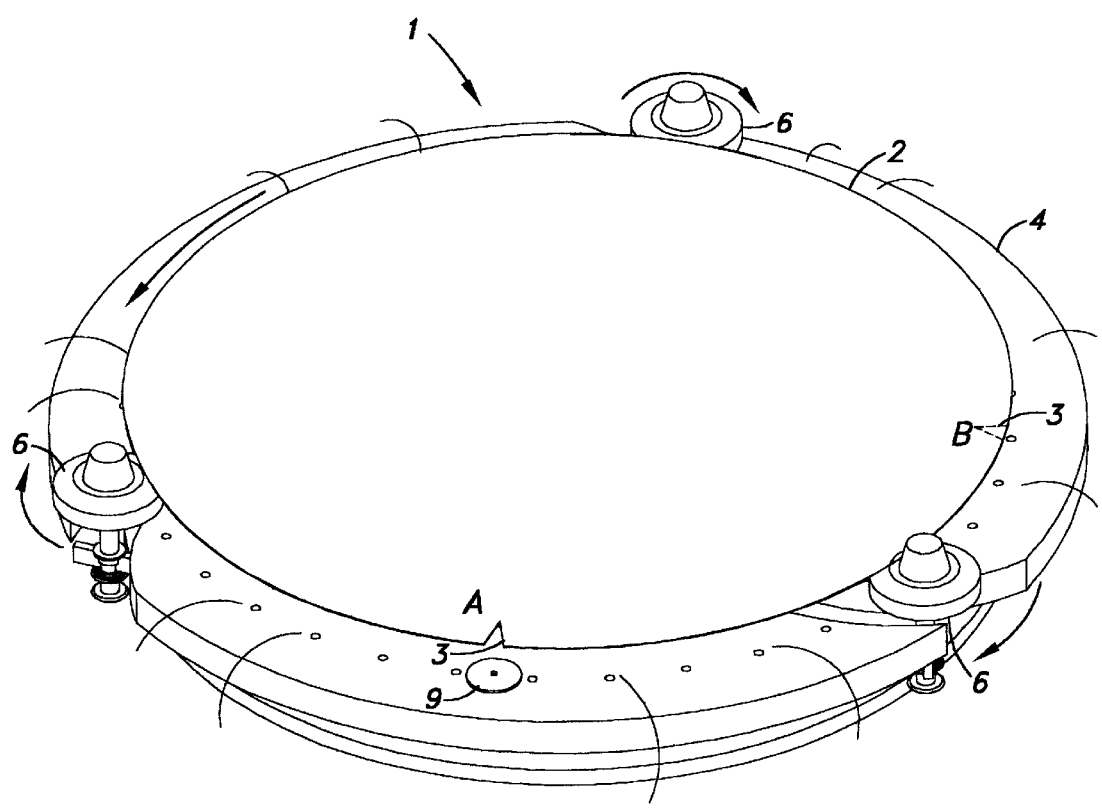
FIG. 10 shows the prealigner of the present invention at a stage after that shown in FIG. 9 in which the wafer is being rotated to its preferred orientation.

FIG. 7 is a flowchart, showing the basic stages in typical operation of the prealigner 1 of the present invention in a series of process blocks. FIGS. 8, 9, and 10 give a pictorial representation of the stages described in FIG. 7. Together the flowchart of FIG. 7, the system components diagram of FIG. 6 and the diagrams of FIGS. 8, 9, and 10 explain the basic operation of the prealigner 1 of the present invention.

Process block 70 indicates the preparatory stage of the operation of the prealigner 1 as illustrated in FIG. 8. The prealigner 1 of FIG. 6 receives data from the host computer 68 indicating what type of wafer is expected. Information such as diameter, thickness, and preferred orientation is received by the prealigner 1. At this stage the air bearing 4 is off in order to not present an unbalanced force on the wafer 2 when it is placed on the prealigner 1.

Process block 71 indicates the wafer rollers 6 are placed in a position to receive the wafer 2. According to the data received by the host computer 68 the wafer rollers 6 are moved into a 'zero' position for the anticipated wafer diameter. The zero position is defined, in the preferred embodiment to be where the wafer roller lip 49 is 10 mm deep, to be at a diameter 8 mm greater than the diameter of the anticipated wafer 2. In this way the wafer 2 may be placed on the prealigner 1 up to 4 mm off of center and still be supported by at least 2 mm of the lip 49 of each wafer roller 6. An off center wafer 2 is drawn in phantom in FIG. 8.

Process block 72 indicates the wafer 2 mounting stage and is illustrated in FIG. 9. The wafer 2 is taken from its cassette 60 and placed on the wafer rollers 6 by a wafer handler 62 of FIG. 6. In the preferred embodiment the wafer handler 62 can place the wafer 2 to within 4 mm of the centered position such that the wafer 2 is supported by the lip 49 of each of the three wafer rollers 6. Once the wafer 2 has been set on the wafer rollers 6 the air table 4 is turned on to the appropriate air mass flow rate, as indicated by the host computer. The airflow should be enough to prevent the wafer from warping while leaving just enough downward force on the wafer rollers 6 to generate the friction needed to rotate the wafer 2. The airflow is indicated in FIG. 9 by the curved lines exiting the gap between the wafer 2 and the air bearing table 4.

Process block 74 indicates the centering operation and is illustrated in FIG. 9. Once the wafer 2 is mounted and the air table 4 has been turned on, the wafer rollers 6 move inward until the vertical portion 51 all three wafer rollers 6 contact the wafer 2. The large arrows in FIG. 9 show this inward motion. Once all three wafer rollers 6 have made contact with the wafer 2, the wafer 2 is centered to within the limits presented by the circularity of the wafer 2 itself.

Process block 76 indicates the pressure relief operation and is illustrated in FIG. 9. Once the wafer 2 is centered, the wafer rollers 6 are moved out slightly to relieve pressure on the wafer 2. This motion is shown by the small arrows in FIG. 9. A common circularity tolerance for silicon wafers 2 is ±0.1 mm. In the preferred embodiment the wafer rollers 6 will retract 0.1 mm to relieve any pressure on the wafer 2 and to give clearance so that undue inward pressure is not created as a slightly wider portion of the wafer 2 passes over the wafer rollers 6. Thus the prealigner 1 of the present invention will center a perfectly round wafer 2 to within 0.1 mm. Any wafer within its circularity tolerance of 0.1 mm will be centered to within 0.2 mm.

Once the wafer 2 has been centered and the diameter confirmed then the notch detecting optical switch 9 at the appropriate diameter is activated. In the preferred embodiment the optical switch 9 includes a light source which projects light upward to be reflected off of the wafer 2. The intensity of the reflected light is then monitored by the optical switch 9.

Process block 78 indicates the notch detection sequence and is illustrated in FIG. 10. The wafer rollers 6 spin (in FIG. 10 they are spinning clockwise as shown by arrows) accelerating at a rate predetermined by the host computer 68 so that the wafer rollers 6 do not slip on the wafer 2. The wafer rollers 6 accelerate until either the notch is detected or a predetermined speed is achieved. The wafer rollers 6 spin the wafer 2 (in FIG. 10 it is spinning counterclockwise as shown by an arrow) until the notch 3 passes over the optical notch detector 9 at the orientation marked "A" in FIG. 10. As the leading edge of the notch 3 passes over the optical switch 9 the amount of reflected light received by the optical switch 9 decreases. Once the light received falls below a preset threshold value the optical switch 9 ceases to return a positive signal and commences sending a negative signal. The optical switch 9 continues to return a negative signal until the trailing edge of the notch 3 passes over the optical switch 9 and the amount of reflected light increases above the preset threshold value, at which time the optical switch 9 ceases to return a negative signal and will recommence sending a positive signal. The position of the wafer 2 is recorded each time the optical switch 9 changes signal, from positive to negative, then from negative to positive. The exact position of the notch 3 is taken to be the midpoint of these two switching positions.

Process block 80 indicates the wafer 2 orientation operation and is illustrated in FIG. 10. Once the notch 3 position has been detected the prealigner 1 can calculate the amount and direction of rotation necessary to place the wafer 2 in the desired rotational orientation as indicated by the host computer 68 and shown as orientation "B" in FIG. 10. The prealigner 1 then spins the wafer to the desired position decelerating at the predetermined rate.

Process block 82 indicates the ending operation. Once the wafer 2 is in the desired rotational orientation, the air bearing 4 is turned off and the full weight of the wafer 2 comes to rest on the wafer rollers 6. The host computer 68 of FIG. 6 is notified of completion, the wafer handler 62 removes the wafer 2 from the prealigner 1, and transfers the wafer 2 to the wafer processing station 66. The wafer 2 is delivered to the wafer processing station 66 centered and in its preferred rotational orientation.

Process block 84 indicates the reinitiation operation and is illustrated in FIG. 8. Once the wafer 2 has been removed the prealigner 1 repeats the above sequence, beginning by receiving data for the next wafer 2 from the host computer 68, and moving the wafer rollers 6 to the new zero position.

Figure 11:
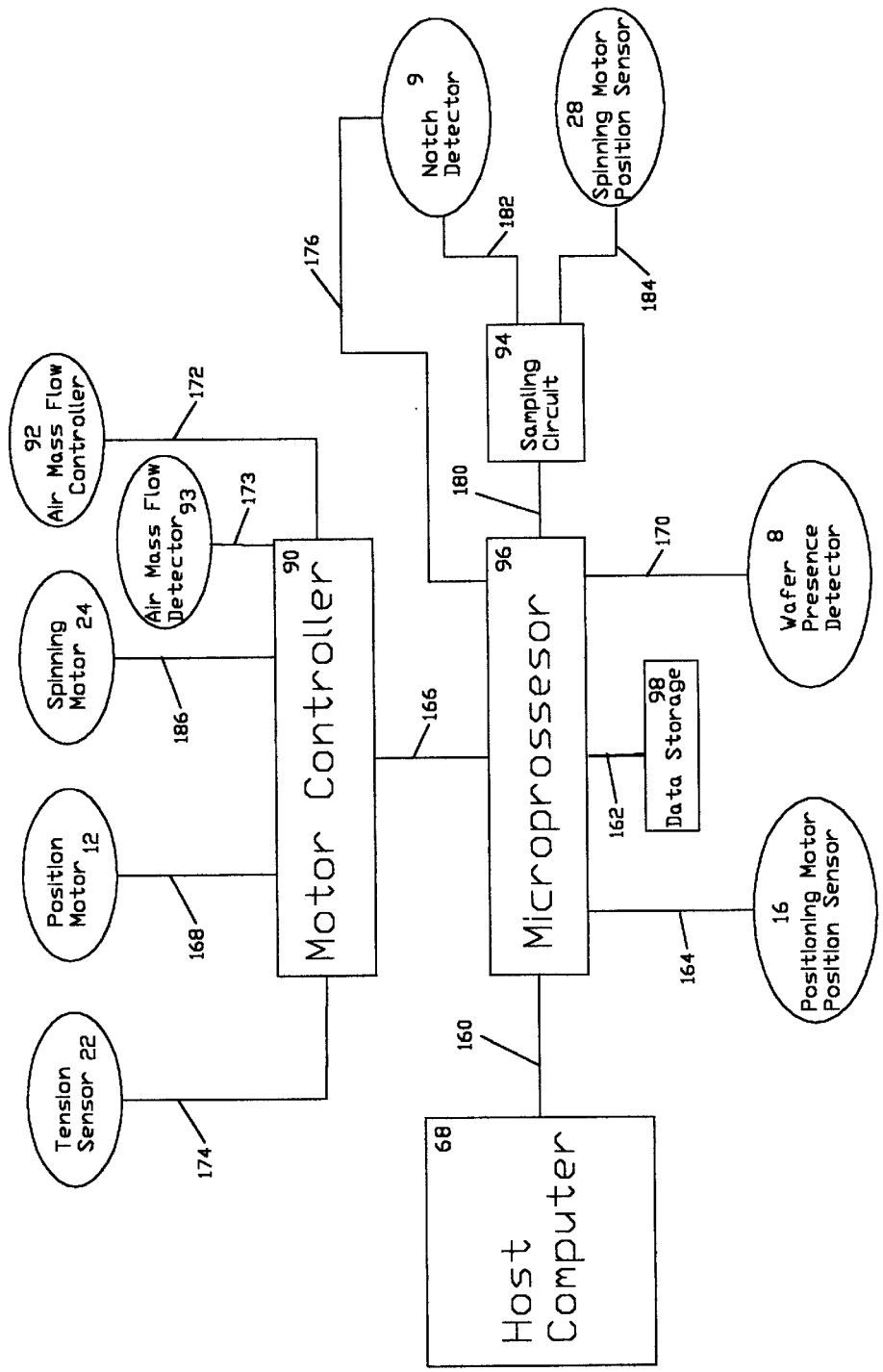
FIG. 11 is a components and signals diagram of the present invention.
Figure 12:
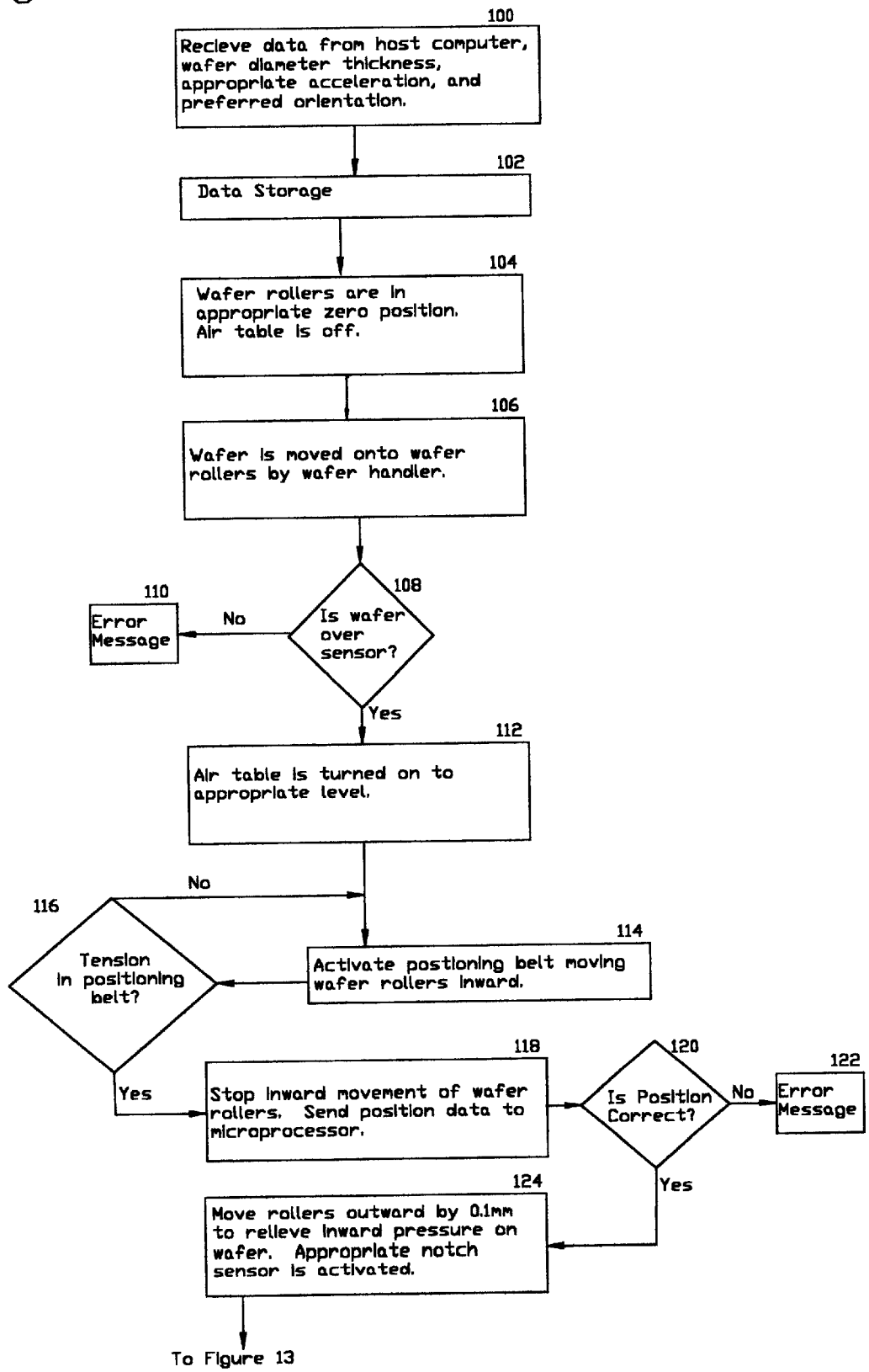
FIG. 12 is a flowchart detailing the operation of the prealigner of the present invention.
Figure 13:
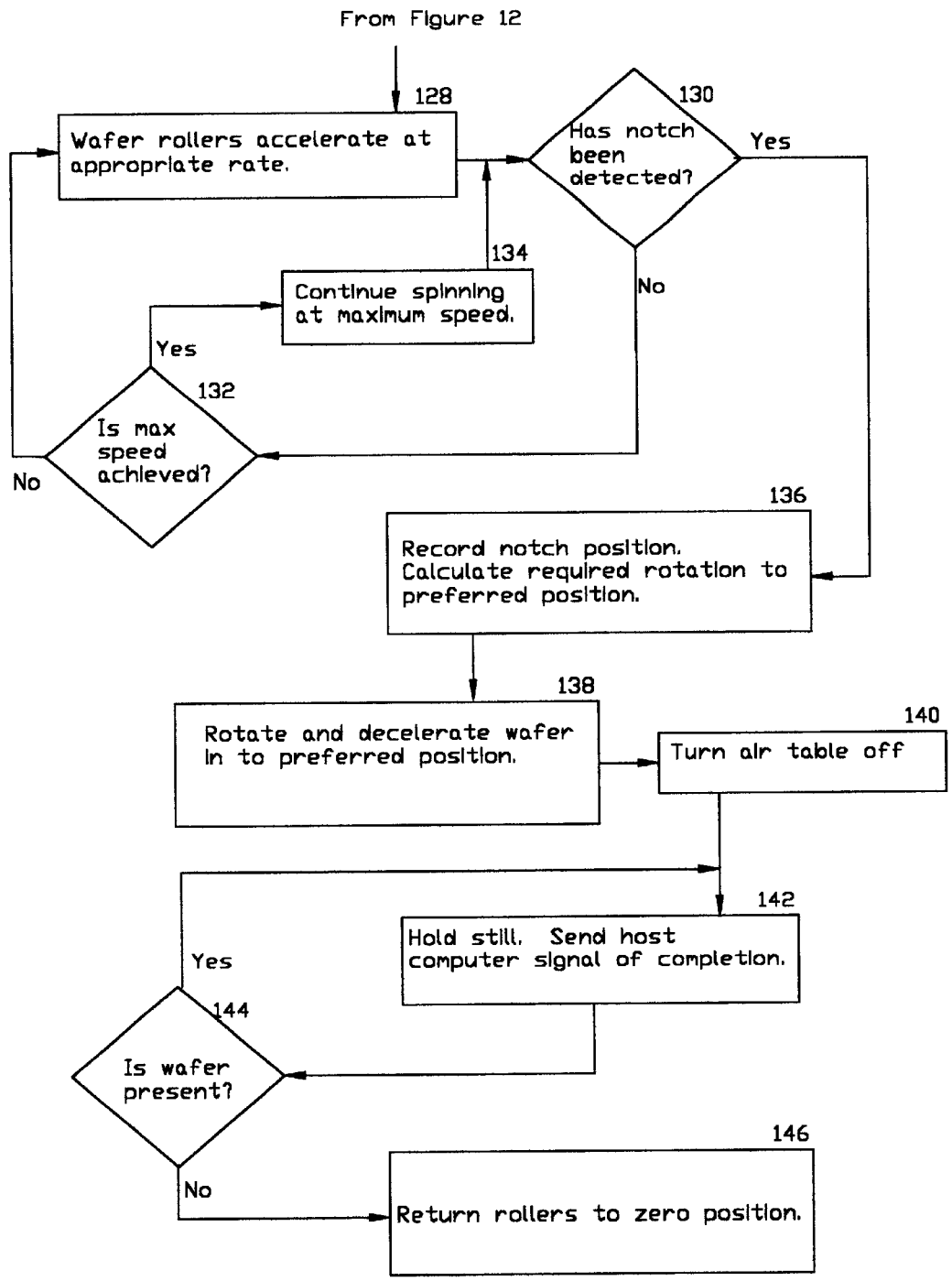
FIG. 13 is a continuation of the flowchart shown in FIG. 12.

A more detailed explanation of the operation of the prealigner of the present invention is given in reference to FIG. 11, FIG. 12 and FIG. 13. FIGS. 12 and 13 are a decision tree showing the order and interaction of the various signals, components, and mechanical operations.

FIG. 11 is a components and signals diagram of the prealigner of the present invention showing the electronic, and electromechanical components and the various signals and drive inputs and outputs. Many components already described are included in FIG. 11 such as: the tension sensor assembly 22, the positioning motor 12, the position sensor 16 attached to the positioning motor 12, the spinning motor 24, the position sensor 28 attached to the spinning motor 24, a notch detector 9, the wafer presence detector 8, and the host computer 68. There are also several components not yet described including a motor controller 90 for actuating the various electromechanical elements of the prealigner. The motor controller 90 takes various data and instruction signals and produces driving currents and voltages to operate the electromechanical elements of the prealigner 1. There is also an air bearing controller 92 which regulates air flow to the air bearing table 4 and an air mass flow detector 93 to give the necessary control feedback. There is a sampling circuit 94 that synchronizes the signals coming from the spinning motor position sensor 28 and the notch detecting optical switch 9. A microprocessor 96 processes input data and sends appropriate control and data signals. A data storage circuit 98 holds information about the current wafer 2 being processed, as well as set points for the various wafers 2 to which the prealigner 1 has been calibrated. The microprocessor 96 and the data storage circuit 98 are shown here as part of the prealigner 1 but they may be physically separate from the prealigner 1, and in fact may simply be a part of the host computer 68. Also shown in FIG. 11 are various data and control signal paths depicted by lines with arrows at one or both ends. These signals will be described in conjunction with the description of FIGS. 12 and 13.

FIG. 12 and FIG. 13 shows a decision tree schematic of the processes both mechanical and electrical by which the prealigner 1 operates, and will be described in conjunction with FIG. 11.

Referring to FIG. 12, Process box 100 indicates that the operation of the preferred embodiment of the prealigner 1 is initiated by a data transfer from the host computer 68 across a host data transfer line 160. Data transmitted gives crucial specifications for the next wafer or batch of wafers including: wafer 2 diameter, wafer 2 thickness, appropriate rate of acceleration, preferred final orientation, and may include other sorts of information that may be used to identify the specific type of wafer 2 to the prealigner such that the prealigner can appropriately process the wafer 2. This information is transmitted across the host data transfer line 160 to the microprocessor 96. The microprocessor 96 is herein loosely defined and includes the accessory circuits necessary to receive process and transmit data, and thus is central to the functioning of the prealigner 1. A host data transfer process 100 is not necessary for each individual wafer 2, since for any batch of wafers 2 all will be similar thus the host data transfer 100 need only take place once per batch if that is preferable. In an alternate embodiment of the present invention host data transfer process 100 can be eliminated from the operation of the prealigner. In the alternate embodiment the prealigner I would be calibrated to only one type of wafer 2, or to a narrow range of wafer 2 types that could be distinguished by the various sensors of the prealigner 1, thus eliminating the need for communication with a host computer 68. This alternate embodiment will not be further described since it is not the preferred embodiment but is should be noted that all the other processes not yet described which use the host data transfer line 160 would also be eliminated from the operation of the prealigner 1.

Process block 102 indicates that the data received from the host computer 68 by the microprocessor 96 is transmitted to the data storage circuit 98 across the data storage and recall line 162. This data is stored to be recalled for later processes in the operation of the prealigner 1. Some data may be permanently stored in the data storage circuit 98 such as calibration tables, appropriate wafer roller 6 zero positions for various wafer 2 diameters, and other data which is not necessarily transmitted by the host computer 68 for each wafer, but which may be accessed by the microprocessor 96 and correlated to the specific wafer 2.

Process block 104 indicates the prealigner 1 preparing for an incoming wafer. First the microprocessor 96 observes the position of the wafer rollers 6, as sensed by the positioning motor position sensor 16 and transmitted on the wafer roller position data input line 164. The microprocessor 96 then compares the current position with the zero position for the given wafer 2 diameter, and continues to perform this comparison throughout the preparation process 104. The microprocessor 96 transmits instructions to, and receives feedback from, motor controller 90 across a motor control data line 166. In the preparation process 104 the microprocessor 96 instructs the motor controller to make sure the air table 4 is turned off, and to activate the positioning motor 12. The motor controller 90 sends a drive voltage and current (or alternately a pressure and airflow if a pneumatically actuated motor is used) through the positioning motor drive line 168 to activate the positioning motor 12. The microprocessor 96 continues to observe actual position, compare with desired position, and instruct the motor controller 90 to activate the positioning motor 12 until the wafer rollers 6 are in the appropriate zero position. When the wafer rollers 6 are in the appropriate zero position the microprocessor 96 sends a "ready for wafer" signal to the host computer 68 across the host data transfer line 160.

Process block 106 indicates the wafer handler 62 is instructed by the host computer 68 to take a wafer 2 from its Cassette 60 and place it on the prealigner 1. Decision block 108 indicates that the microprocessor 96 has activated the wafer presence detecting optical switch 8 and is monitoring the wafer presence signal 170 coming from the optical switch 8. The wafer presence detecting optical switch 8 is much like the notch detecting optical switch 9. A threshold value of reflected light at which the switch 8 returns a positive signal is set to correspond with the wafer 2 having been placed on the prealigner 1. If after a certain pre set period the microprocessor 96 does not detect the signal indicating wafer presence, the microprocessor 96 sends an error signal to the host computer 68 as indicated by process block 110.

Process block 112 indicates that once the wafer 2 has been detected, the air table is turned on to the appropriate level. More specifically, once the wafer presence signal 170 is detected, the microprocessor 96 retrieves from data storage 98 the datum indicating the appropriate air mass flow rate for this particular wafer 2. The microprocessor then sends instructions to the motor controller 90 to deliver the appropriate air mass flow. The motor controller then sends an air control signal 172 to the air mass flow controller 92 to increase the air mass flow rate until the air mass flow detector 93 returns an air flow signal 173 that corresponds with the desired air mass flow rate. Once the desired air mass flow rate is achieved, the motor controller 90 sends a signal of completion to the microprocessor 96. The motor controller continues to monitor the air flow signal, and adjust the air mass flow controller to keep air mass flow at the desired level.

Process block 114 indicates the next process in the operation of the prealigner 1 in which the wafer rollers 6 clamp and center the wafer 2. The microprocessor 96 instructs the motor controller 90 to commence inward motion of the wafer rollers 6. The motor controller 90 sends an activating voltage and current signal 168 to the positioning motor 12 causing the wafer rollers 6 to move slowly inward.

Decision block 116 indicates that the motor controller 90 is monitoring the tension signal 174 coming from the positioning belt tension sensor. As long as belt tension is not indicated, the inward motion of the wafer rollers 6 continues. Once the tension signal 174 reaches a threshold level, (or in the case of the tension sensor being a simple switch, the tension signal 174 would change states) the motor controller 90 immediately ceases to drive the positioning motor 12, halting the inward progression of the wafer rollers 6 as indicated by process block 118. The microprocessor 96 then records the position of the wafer rollers 6 as indicated by the positioning motor position sensor 16.

Decision block 120 indicates that the microprocessor 96 then compares the recorded position and thus diameter of the wafer 2 with the expected diameter for that wafer 2. If the diameters differ by more then a preset amount, the microprocessor 96 returns an error signal to the host computer 68 as indicated by process block 122.

If the diameter of the wafer 2 is found to be as expected, the inward pressure on the wafer 2 is relieved, which process block 124 indicates. The microprocessor 96 instructs the motor controller 90 to move the wafer rollers 6 outward slowly. Meanwhile the microprocessor 96 monitors the positioning motor position signal 164. When a 0.1 mm increase in diameter has been achieved the microprocessor 96 instructs the motor controller 90 to stop the outward motion of the wafer rollers 6. While the pressure is being relieved the microprocessor sends a notch detector activation signal 176, which activates the appropriate notch detector 9 for the current wafer diameter.

Process block 126 indicates that the microprocessor 96 begins monitoring a coordinated notch detection signal 180. The coordinated notch detection signal 180 consists of pairs of data points, each pair consists of a switch signal 182, and a spinning motor position signal 184. The switch signal 182 is the signal from the activated notch detecting optical switch, and the spinning motor position signal 184 is from the spinning motor position sensor 28. The sampling circuit 94 to pairs a switch signal 182 and a spinning motor position signal 184 from the exact same moment in time, and sends it in a discreet data package which is the coordinated notch detection signal 180. The sampling circuit samples at a constant frequency such that at the maximum rotational speed, the amount of arc length passed per sample is smaller than the degree of precision required of the prealigner 1.

Referring to FIG. 13, which is a continuation of FIG. 12, process block 128 indicates that the wafer begins spinning. The microprocessor 96 instructs the motor controller 90 to activate the spinning motor 24 by sending a drive voltage and current signal 186 to the spinning motor 24. The spinning motor 24 then accelerates at the rate indicated for that particular wafer 2 by the initial packet of information received from the host computer 68, or by internal calibrated set points from data storage 98. Accelerating at a specific rate is very important. Although operation should be as quick as possible, the wafer rollers 6 must not slip on the bottom of the wafer 2. Excessive acceleration would cause such slipping. If the wafer rollers 6 were to slip, the rotational position of the wafer 6 would no longer correlate with the rotational position of the spinning motor 24, and the prealigner could not give accurate rotational alignment. Slippage would also create undesirable particle generation.

Decision block 130 indicates that the microprocessor 96 monitors the coordinated notch detection signal 180 to determine whether the switch signal 182 has switched polarities twice. Two reversals of switch signal 182 polarity indicates that both edges of the notch 3 have passed over the optical switch 9, thus the notch 3 is detected. If the notch 3 has not been detected, the operation of the prealigner 1 moves on to decision block 132, which determines if the maximum rotational velocity has been achieved. The microprocessor 96 monitors the coordinated notch detection signal 180 and determines the rate of rotation by comparing the spinning motor position signal 184 between a number of time intervals. The microprocessor 96 then compares the observed rotational speed to a maximum speed set point obtained in the initial packet of information received from the host computer 68, or out of internally calibrated set points from data storage 98. If the observed rotational speed is less than the maximum speed set point, the operation of the prealigner 1 returns to process block 128 and the wafer 2 continues to be accelerated. If the rotational speed has reached the maximum speed set point, the operation of the prealigner 1 moves to process block 134 where the spinning motor 24 is instructed to continue spinning at the maximum speed. These logic loops continue such that the wafer 2 accelerates until either maximum speed is reached or the notch 3 has been detected. Once maximum speed has been reached the wafer continues spinning at the maximum speed until the notch has been detected. Once the leading and trailing edge of the notch 3 have passed over the optical switch 9, the notch 3 has been detected and operation of the prealigner moves on to process block 136.

Process block 136 indicates a microprocessor 96 calculation sequence. The microprocessor calculates the exact notch 3 position to be the midpoint between the leading and trailing edges of the notch 3. More specifically the notch 3 position is the midpoint between the positions (as indicated by the spinning motor position sensor 28) where the notch detecting optical switch signal 182 changes polarities. Switch signal 182 polarity change is due to reflected light received by the optical switch 9 falling below then back above a set threshold as the notch 3 passes over the optical switch 9 (in the position marked A in FIG. 5). Once the exact notch 3 position is determined then the rotation required to bring the notch 3 to the preferred position (marked as B in FIG. 5) is calculated.

Process block 138 indicates the process of moving the wafer 2 into position. The microprocessor 96 calculates the quickest rotation and deceleration sequence to bring the notch 3 to the preferred position. The microprocessor 96 then instructs the motor controller 90, which in turn sends the drive signals 186 necessary to slow the wafer 2 to a stop in the desired position. Once the wafer 2 is stopped, the microprocessor 96 double checks the spinning motor position sensor signal 184 and makes sure the wafer 2 is in the desired position. If not the necessary corrections are made.

Process block 140 indicates that in normal operation the air table 4 is then turned off and the full weight of the wafer 2 comes to rest on the lip 49 of the wafer rollers 6. In modes of operation where a very thin wafer 2 is being processed, such that part of the weight of the wafer 2 must always be supported by the air table 4, the air table 4 is then only turned down by some fraction at this stage.

Process block 142 indicates the prealigner has stopped and sends a signal of completion. Once the wafer 2 has stopped in the preferred position and the air table 4 has been turned off, the microprocessor 96 sends a completion signal over the host data transfer line 160 to the host computer 68. The host computer 68 will then instruct the wafer handler 62 to retrieve the wafer 2.

Decision block 144 indicates that the microprocessor 96 monitors the wafer presence detector 8 and continues to send its completion signal as long as the wafer 2 is present.

Process block 146 indicates that as soon as the wafer 2 is no longer present the sequence begins again at process block 100. As soon as the host computer 68 is no longer receiving the signal of completion, it can send data for the next wafer 2, reinitiating the process.

While preferred embodiment of the invention has been shown and described, it will be apparent to those skilled in the art that various modifications may be made without departing from the scope of the invention. Therefore, it is intended that the invention not be limited to the particular embodiments disclosed but that the scope of the invention be defined by the following claims.

What is claimed is:

1. An apparatus for centering and aligning a disk-like article having an outer periphery comprising;
   a main body having a center point;
   a plurality of rollers that are moveably attached to said main body wherein each of said rollers is radially moveable relative to said center point and rotatable about its respective axis of rotation;
   wherein said rollers contact the periphery of said disk-like article when they are moved radially inward, thereby centering said disk-like article concentrically with the center point of said main body and wherein said rollers are capable of spinning said disk-like article when contacting the edges of said disk-like article whereby said disk-like article can be rotationally oriented.

2. The apparatus of claim 1 wherein said rollers are radially moveable by a distance sufficient to allow alignment and orientation of disk-like articles that have a variation in diameter of up to 6 inches.

3. The apparatus of claim 1 wherein said disk-like article is held in a substantially horizontal position when said rollers contact the periphery of said disk-like article.

4. The apparatus of claim 1 wherein said rollers are radially moveable by a distance sufficient to allow disk-like articles of varying sizes to be aligned and oriented in said apparatus.

5. The apparatus of claim 1 wherein said rollers support at least a portion of the weight of said disk-like article when they contact the periphery of said disk-like article.

6. The apparatus of claim 5 wherein said disk-like article is held in a substantially horizontal position when said rollers contact the periphery of said disk-like article.

7. The apparatus of claim 1 further comprising a sensor to detect when said rollers make contact with the periphery of said disk-like article and a controller that stops motion of said rollers based on data from said sensor.

8. The apparatus of claim 7 further comprising a belt drive that moves said rollers radially relative to said center point and wherein said sensor comprises a tension sensor on said belt drive.

9. The apparatus of claim 1 further comprising a notch sensor attached to said main body for detecting a discontinuity in the periphery of said disk-like article.

10. The apparatus of claim 9 wherein said rollers spin said disk-like article to a predetermined orientation based upon a signal from said notch sensor.

11. The apparatus of claim 9 wherein said notch sensor comprises a light source and a light receiver both disposed on one side of said disk-like article wherein said light receiver detects light from said light source that is reflected off of the surface of said disk-like article.

12. The apparatus of claim 1 wherein said apparatus includes exactly three rollers that are moveably attached to said main body and wherein each of said three rollers is radially moveable relative to said center point and rotatable about its respective axis of rotation.

13. The apparatus of claim 2 wherein each of said rollers comprises a central vertical portion with a first slope and a lip attached to the bottom of said central vertical portion with a second slope that is shallower than said first slope wherein said disk-like article is supported on said lip when said rollers contact the periphery of said disk-like article.

14. The apparatus of claim 13 wherein said disk-like article is held in a substantially horizontal position when said rollers contact the periphery of said disk-like article.

15. The apparatus of claim 1 wherein said main body comprises a plate with apertures therein and a blower that forces a flow of air through said apertures to create an air bearing support for supporting at least a portion of the weight of said disk-like article.

16. The apparatus of claim 15 wherein said disk-like article is held in a substantially horizontal position when said rollers contact the periphery of said disk-like article.

17. The apparatus of claim 15 wherein said rollers support at least a portion of the weight of said disk-like article when they contact the periphery of said disk-like article.

18. The apparatus of claim 17 wherein said disk-like article is held in a substantially horizontal position when said rollers contact the periphery of said disk-like article.

* * * * *